United States Patent
Jacob et al.

(10) Patent No.: US 9,263,580 B2
(45) Date of Patent: Feb. 16, 2016

(54) METHODS OF FORMING ISOLATED CHANNEL REGIONS FOR A FINFET SEMICONDUCTOR DEVICE AND THE RESULTING DEVICE

(71) Applicants: GLOBALFOUNDRIES Inc., Grand Cayman (KY); STMicroelectronics, Inc., Coppell, TX (US)

(72) Inventors: Ajey Poovannummoottil Jacob, Watervliet, NY (US); Nicolas Loubet, Guilderland, NY (US)

(73) Assignees: GLOBALFOUNDRIES Inc., Grand Cayman (KY); STMICROELECTRONICS, Inc., Coppell, TX (US)

( * ) Notice: Subject to any disclaimer, the term of this patent is extended or adjusted under 35 U.S.C. 154(b) by 0 days.

(21) Appl. No.: 14/223,373

(22) Filed: Mar. 24, 2014

(65) Prior Publication Data

US 2015/0270398 A1   Sep. 24, 2015

(51) Int. Cl.
| | |
|---|---|
| *H01L 29/78* | (2006.01) |
| *H01L 29/66* | (2006.01) |
| *H01L 29/51* | (2006.01) |
| *H01L 21/308* | (2006.01) |
| *H01L 21/28* | (2006.01) |

(52) U.S. Cl.
CPC ...... *H01L 29/7849* (2013.01); *H01L 21/28194* (2013.01); *H01L 21/3085* (2013.01); *H01L 29/515* (2013.01); *H01L 29/6681* (2013.01); *H01L 29/785* (2013.01); *H01L 29/7848* (2013.01)

(58) Field of Classification Search
CPC ............... H01L 21/823431; H01L 21/845; H01L 29/7849; H01L 29/6681; H01L 29/7848; H01L 29/575
See application file for complete search history.

(56) References Cited

U.S. PATENT DOCUMENTS

| | | | |
|---|---|---|---|
| 2012/0091528 A1 | 4/2012 | Chang et al. | |
| 2013/0122676 A1* | 5/2013 | Jeng ................ | H01L 21/823431 438/306 |
| 2015/0001468 A1* | 1/2015 | Huang .............. | H01L 29/66977 257/24 |
| 2015/0091094 A1* | 4/2015 | Wan .................... | H01L 27/1211 257/369 |
| 2015/0102411 A1* | 4/2015 | Ching .............. | H01L 21/76205 257/347 |

* cited by examiner

*Primary Examiner* — Marc Armand
*Assistant Examiner* — Wasiul Haider
(74) *Attorney, Agent, or Firm* — Amerson Law Firm, PLLC

(57) ABSTRACT

One method disclosed includes, among other things, forming a fin structure comprised of a semiconductor material, a first epi semiconductor material and a second epi semiconductor material, forming a sacrificial gate structure above the fin structure, forming a sidewall spacer adjacent the sacrificial gate structure, performing at least one etching process to remove the portions of the fin structure positioned laterally outside of the sidewall spacer so as to thereby define a fin cavity in the source/drain regions of the device and to expose edges of the fin structure positioned under the sidewall spacer, and performing an epitaxial deposition process to form an epi etch stop layer on the exposed edges of the fin structure positioned under the sidewall spacer and within the fin cavity.

8 Claims, 14 Drawing Sheets

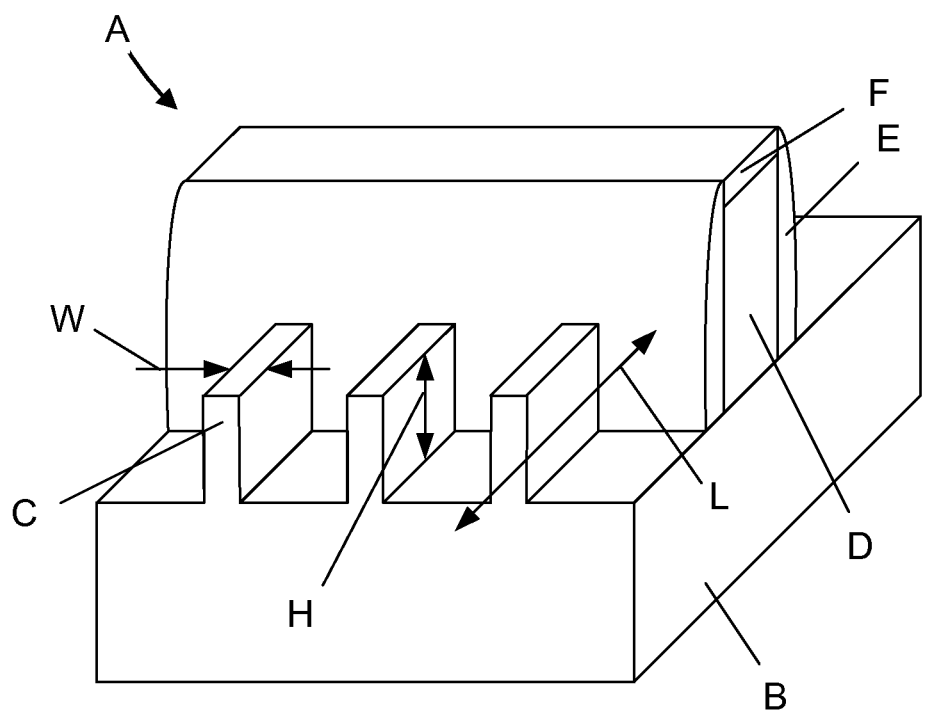
Figure 1A (Prior Art)
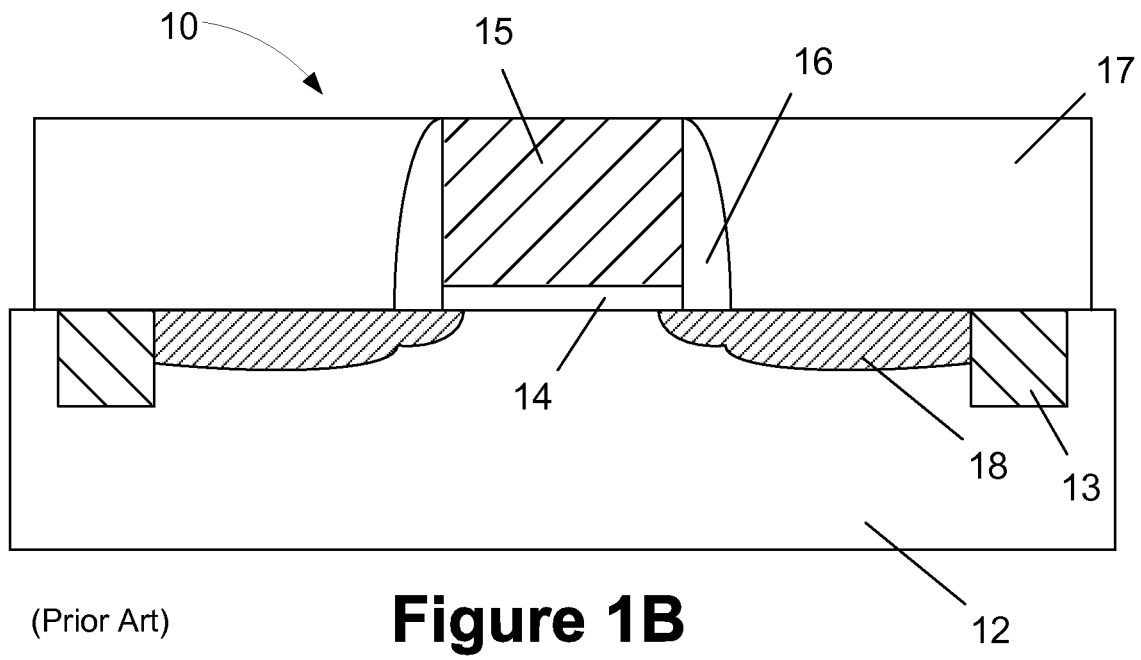
(Prior Art) Figure 1B

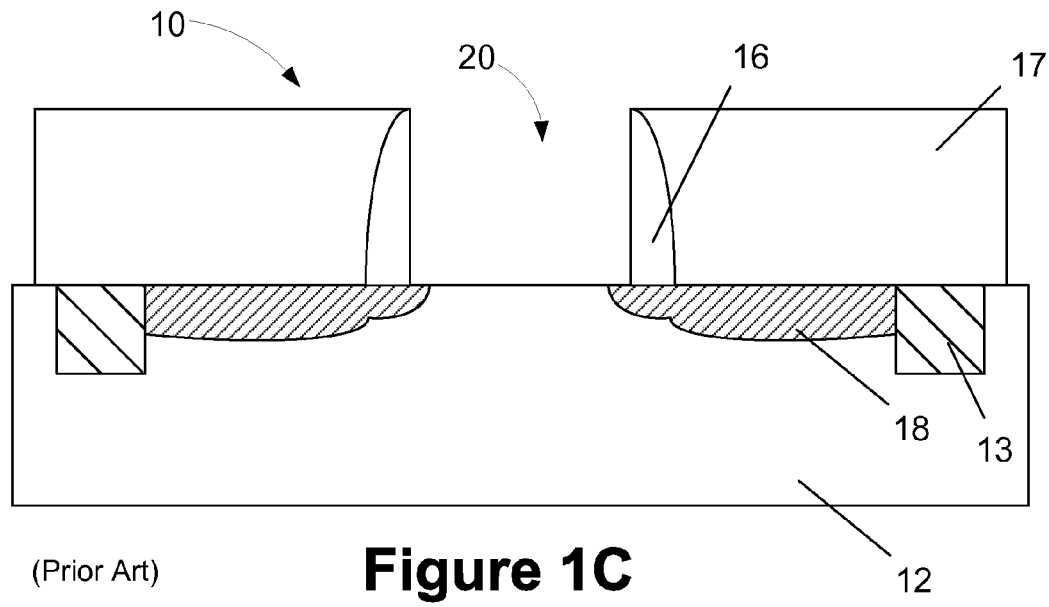
(Prior Art) Figure 1C
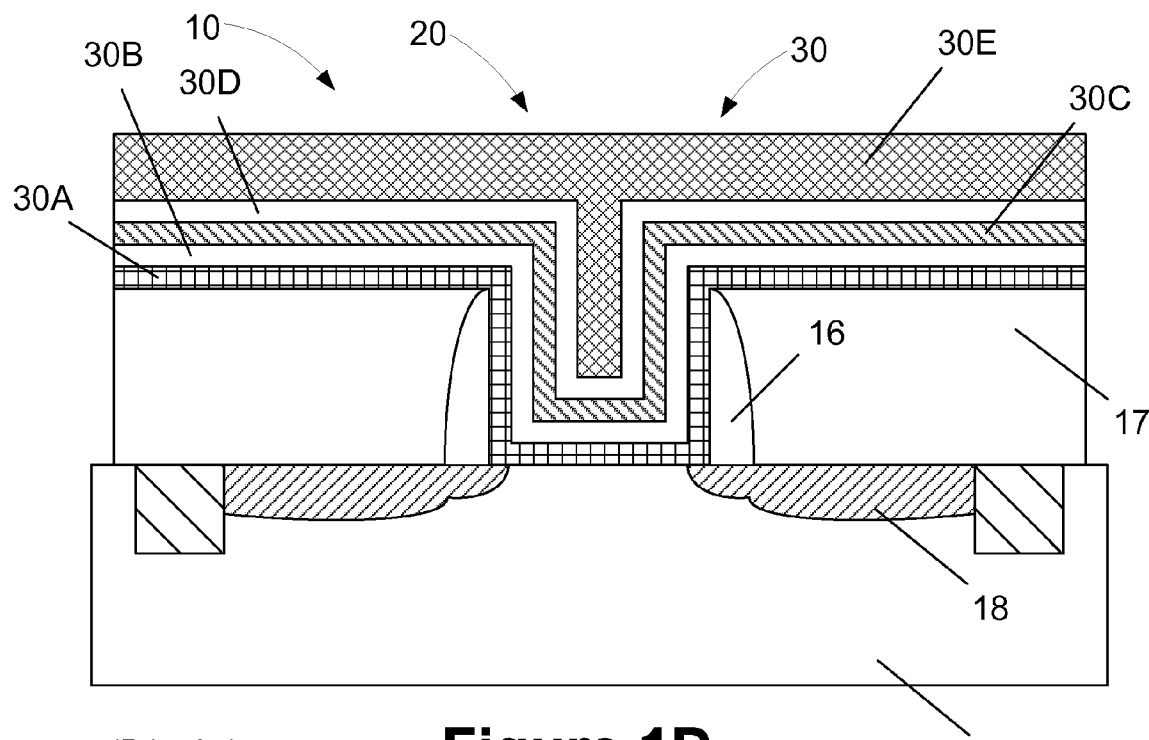
(Prior Art) Figure 1D

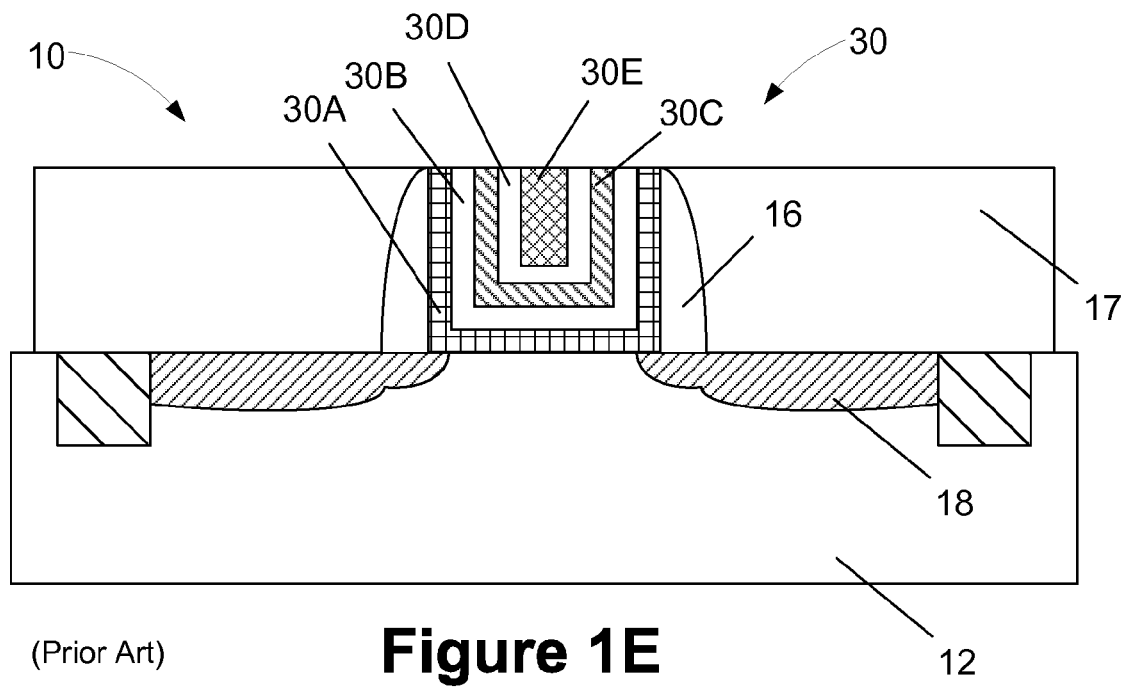
(Prior Art) Figure 1E
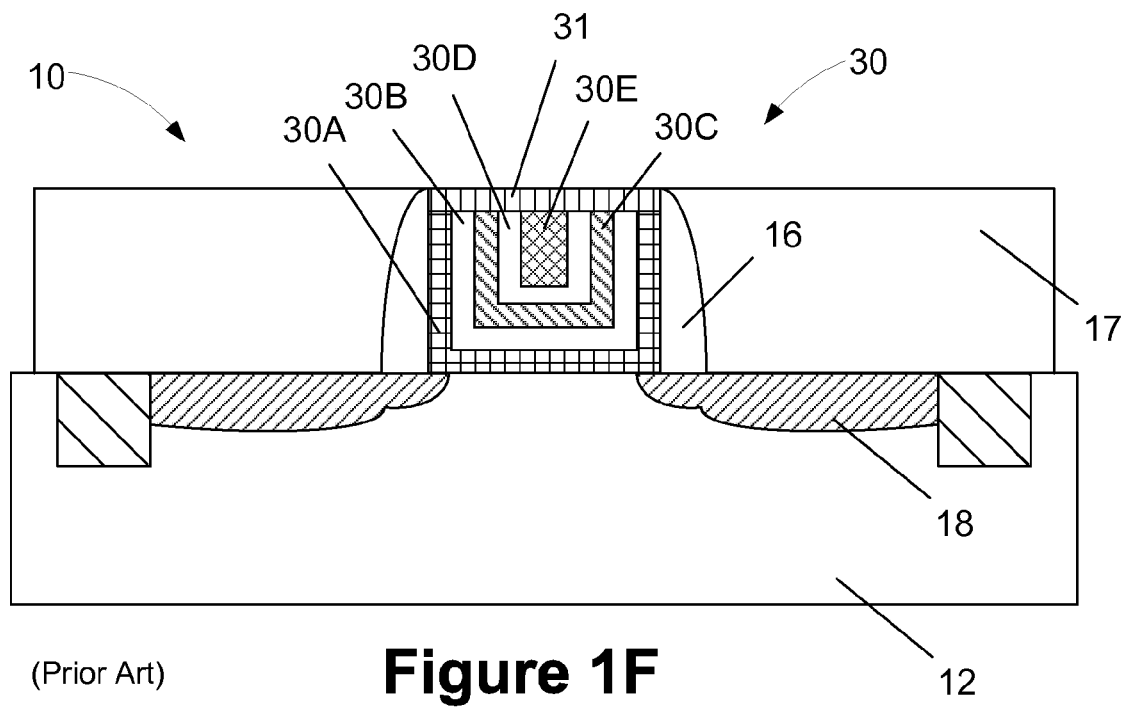
(Prior Art) Figure 1F

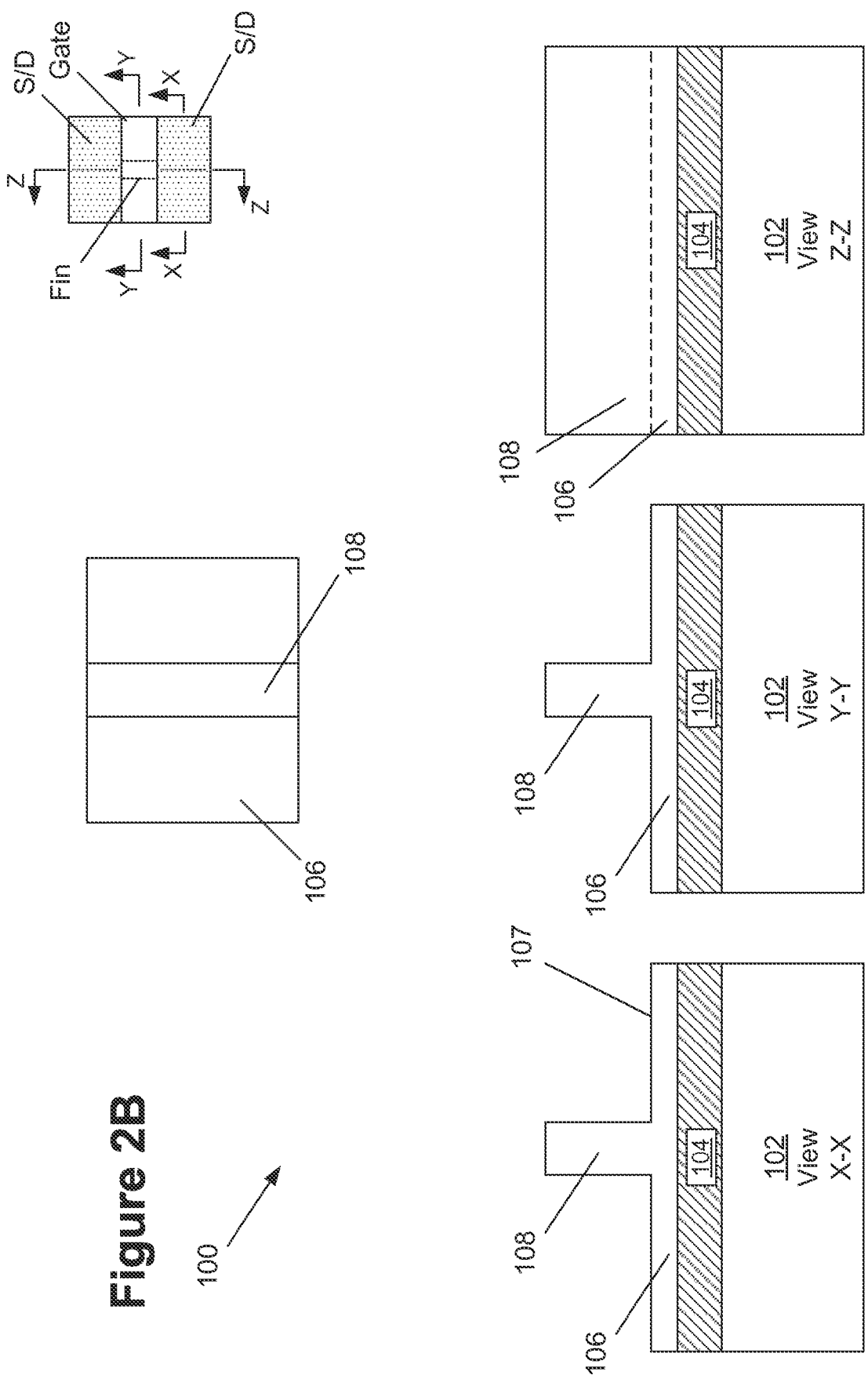

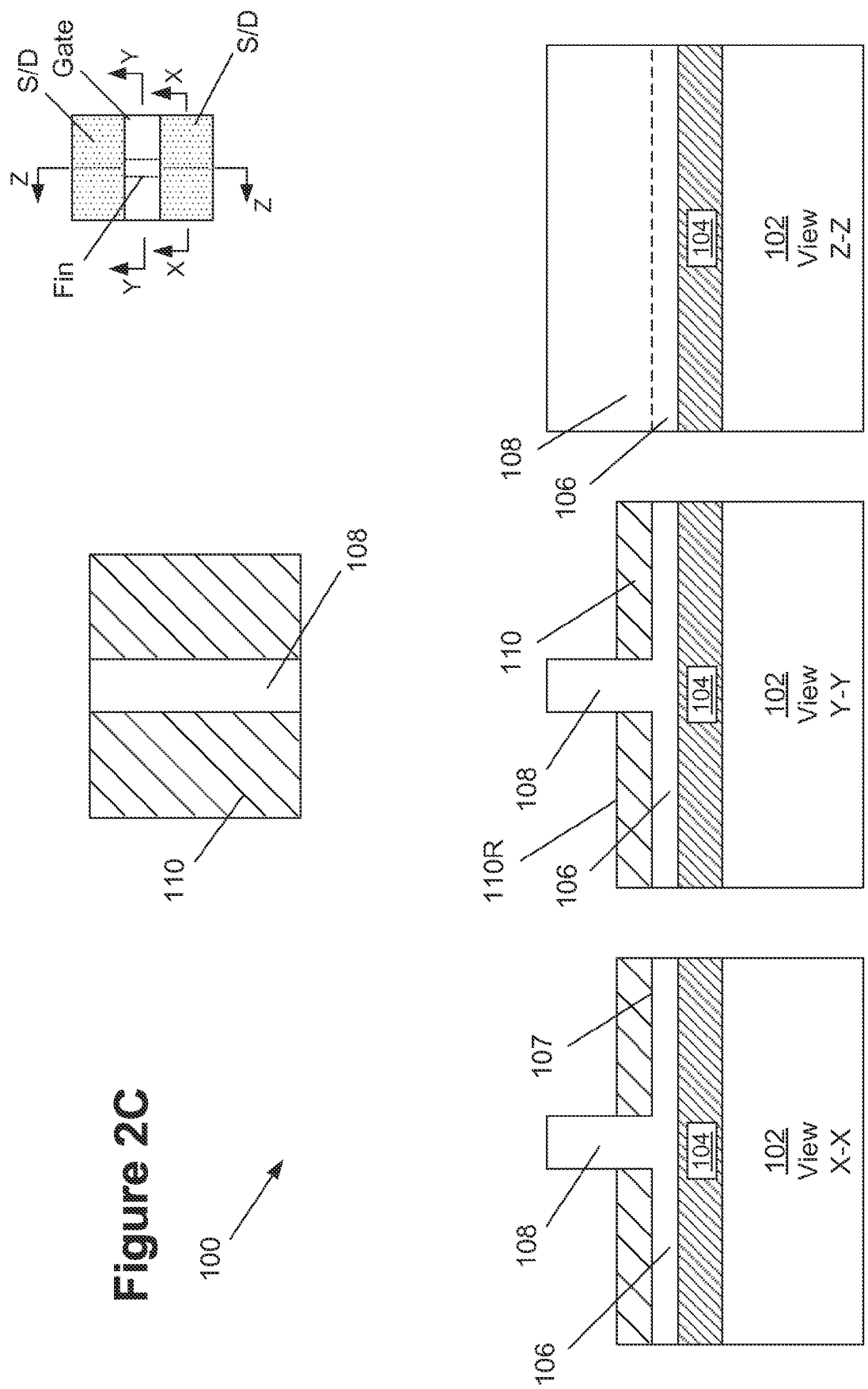

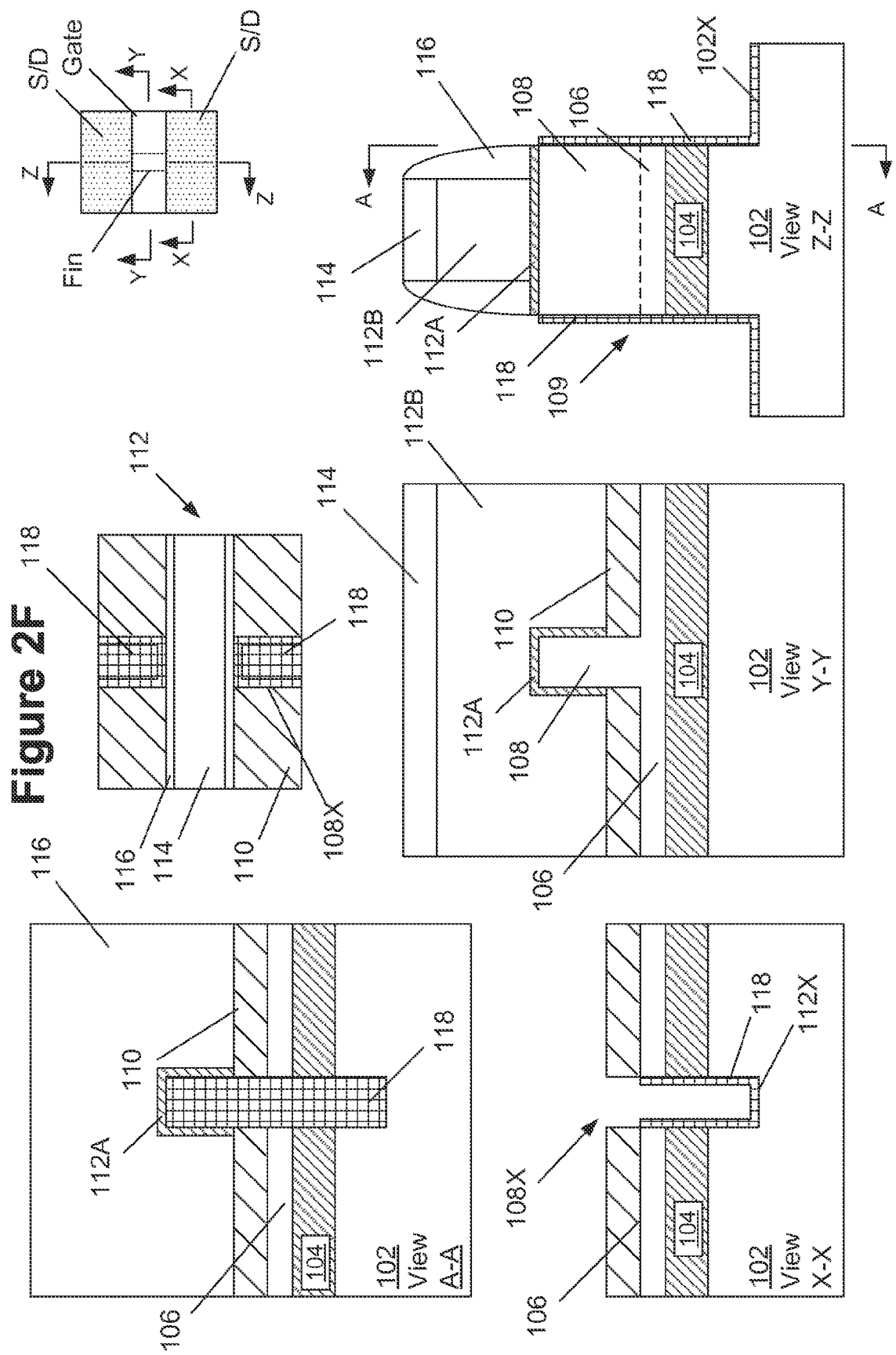

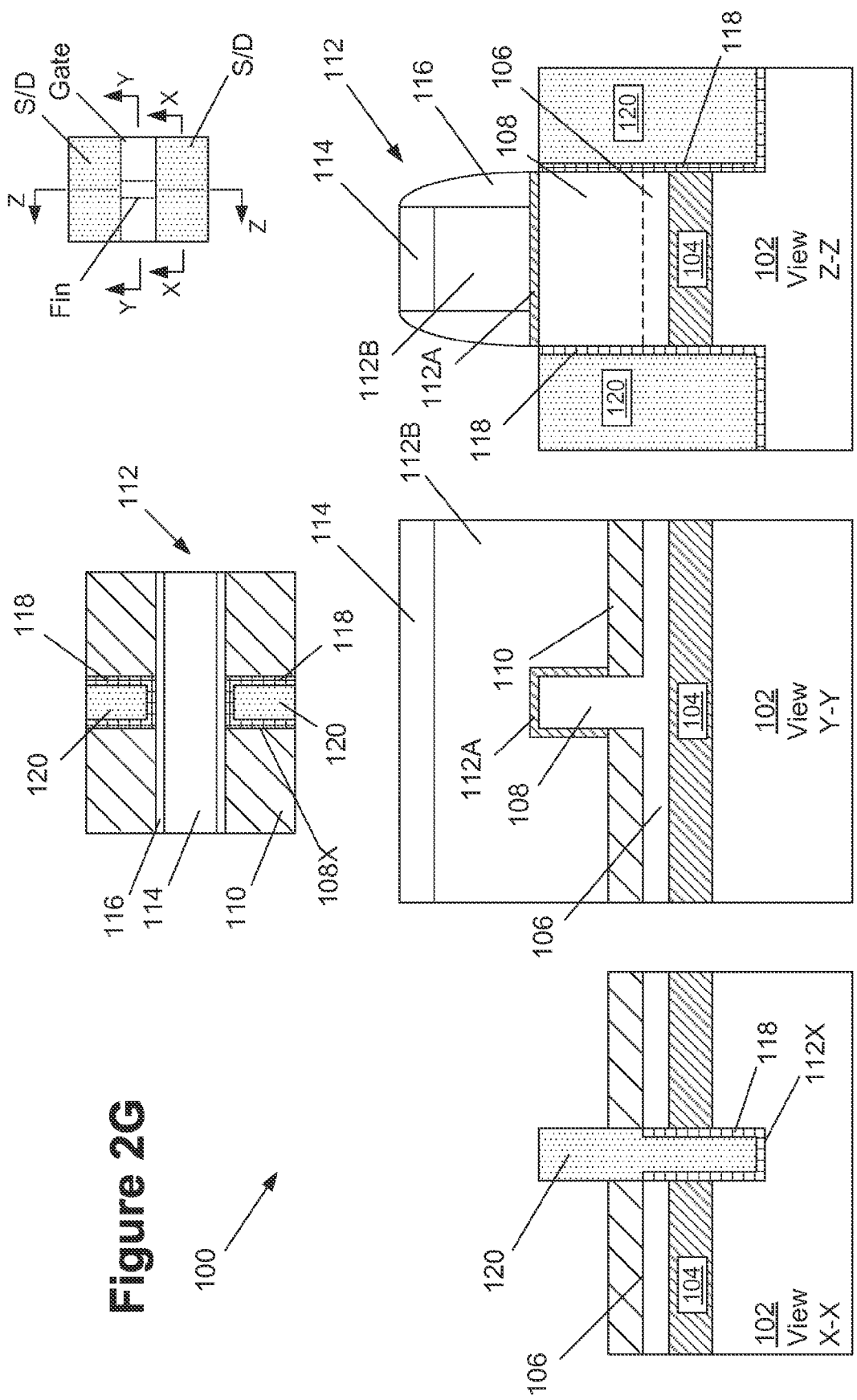

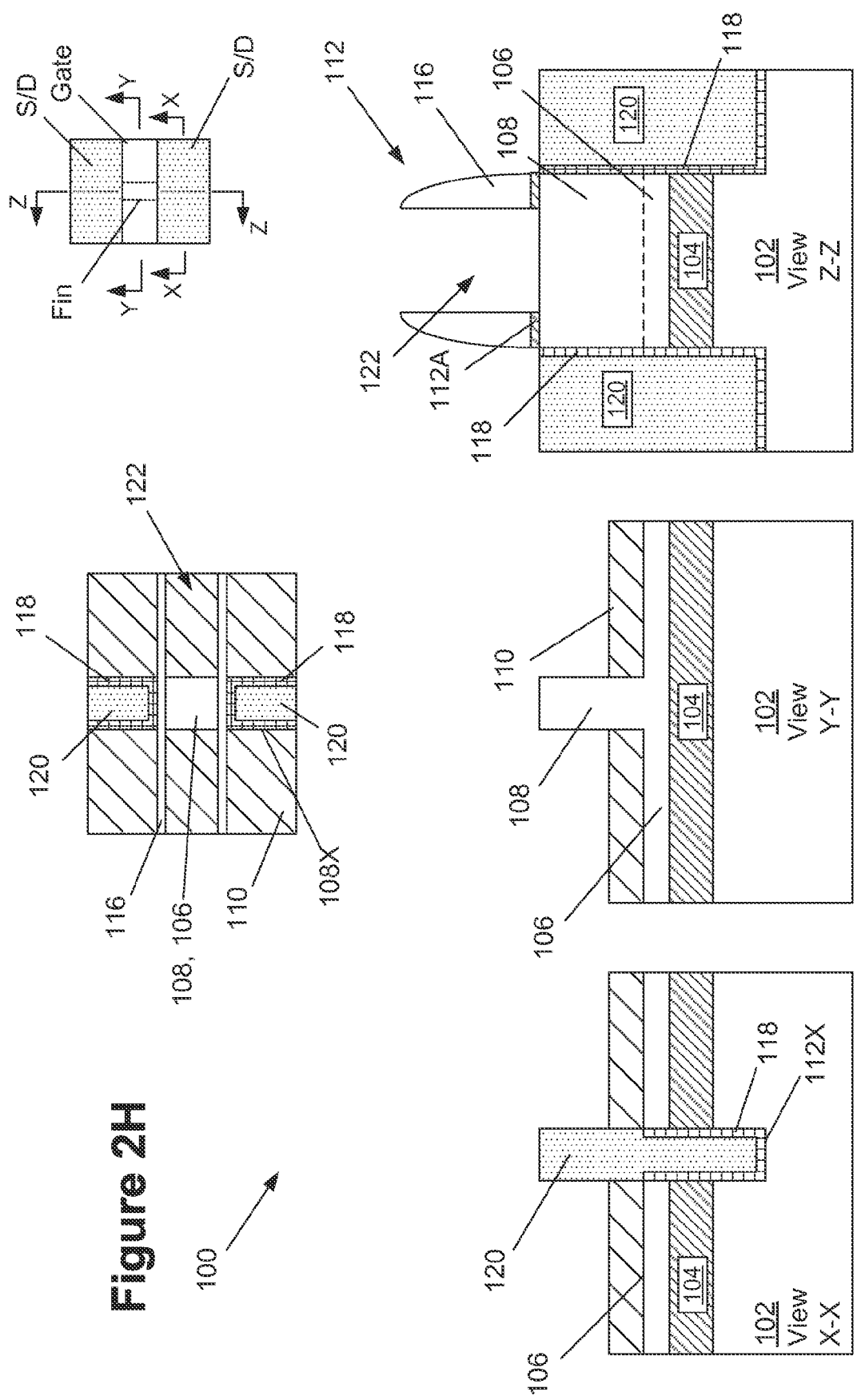

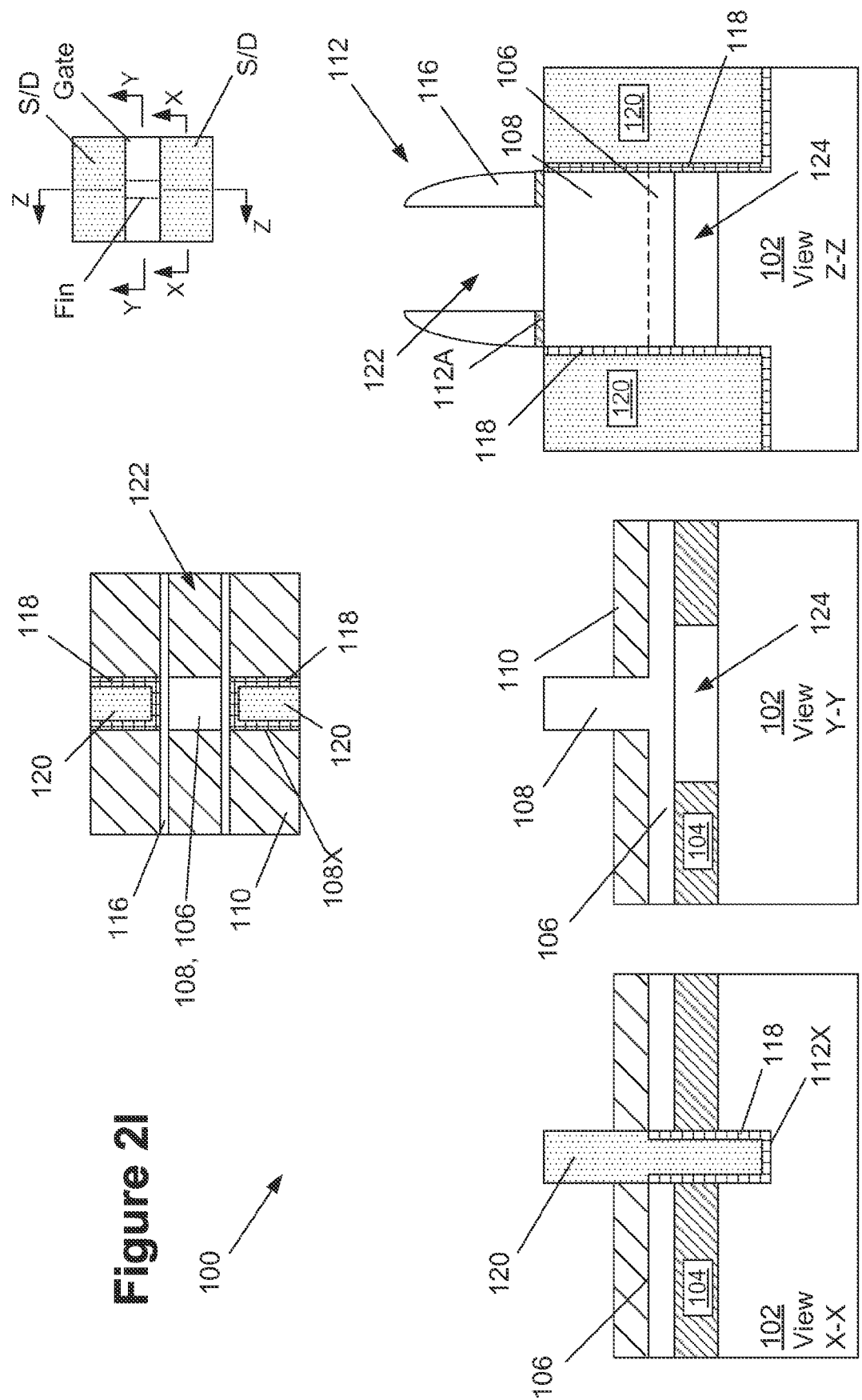

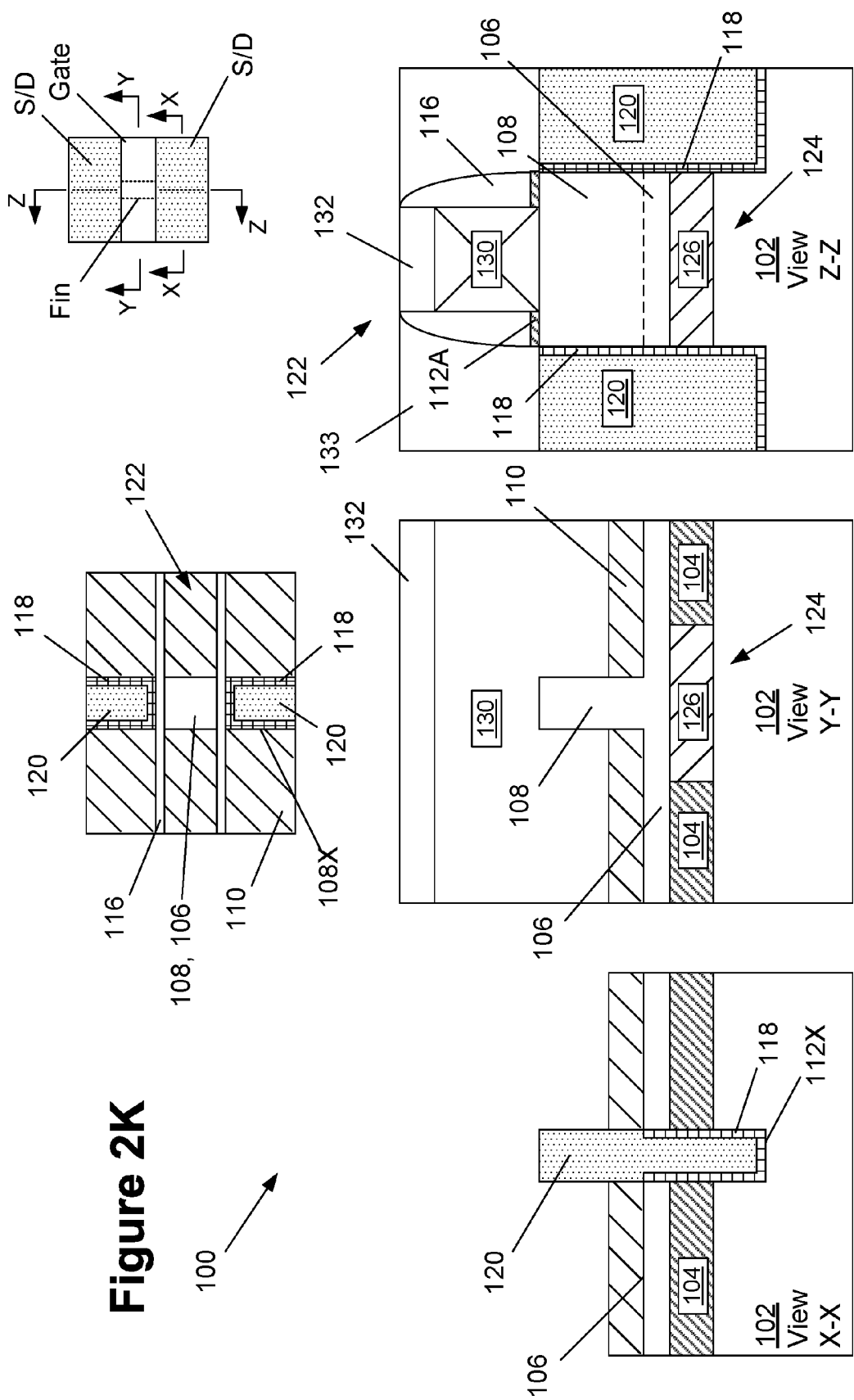

US 9,263,580 B2

METHODS OF FORMING ISOLATED CHANNEL REGIONS FOR A FINFET SEMICONDUCTOR DEVICE AND THE RESULTING DEVICE

BACKGROUND OF THE INVENTION

1. Field of the Invention

The present disclosure generally relates to the fabrication of integrated circuits, and, more particularly, to various methods of forming an isolated channel region for a FinFET semiconductor device and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate-last" or "replacement gate" technique. The replacement gate process may be used when forming planar devices or 3D devices. FIGS. 1B-1F simplistically depict one illustrative prior art method for forming an HK/MG replacement gate structure using a replacement gate technique on a planar transistor device. As shown in FIG. 1B, the process includes the formation of a basic transistor structure above a semiconductor substrate 12 in an active area defined by a shallow trench isolation structure 13. At the point of fabrication depicted in FIG. 1B, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1D, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices which are intended to enhance the performance capabilities of such devices, e.g., to enable low-voltage operation. Device designers are also contemplating ways to form isolation regions under the channel region of a 3D device to improve device performance. What is desired is a reliable and repeatable methodology for forming an isolation region under the channel region of a FinFET device.

The present disclosure is directed to various methods of forming an isolated channel region for a FinFET semiconductor device and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an isolated channel region for a FinFET semiconductor device and the resulting semiconductor device. One method disclosed includes, among other things, forming a fin structure comprised of a semiconductor material, a first epi semiconductor material positioned on and vertically above the semiconductor material and a second epi semiconductor material positioned on and vertically above the first epi semiconductor material, forming a sacrificial gate structure above the fin structure, after forming the sacrificial gate structure, forming a sidewall spacer adjacent the sacrificial gate structure, performing at least one etching process to remove the portions of the fin structure positioned laterally outside of the sidewall spacer so as to thereby define a fin cavity in the source/drain regions of the device and to expose edges of the fin structure positioned under the sidewall spacer, and performing an epitaxial deposition process to form an epi etch stop layer on the exposed edges of the fin structure positioned under the sidewall spacer and within the fin cavity.

Another illustrative method disclosed herein includes, among other things, forming a fin structure comprised of a portion of a silicon substrate, a first epi semiconductor material positioned on and vertically above the portion of the silicon substrate and a second epi semiconductor material positioned on and vertically above the first epi semiconductor material, wherein the second epi semiconductor material is comprised of silicon, forming a sacrificial gate structure above the fin structure, after forming the sacrificial gate structure, forming a sidewall spacer adjacent the sacrificial gate structure and performing at least one etching process to remove the portions of the fin structure positioned laterally outside of the sidewall spacer so as to thereby define a fin cavity in the source/drain regions of the device and to expose edges of the fin structure positioned under the sidewall spacer. In this embodiment, the method further includes performing an epitaxial deposition process to form an epi etch stop layer on the exposed edges of the fin structure positioned under the sidewall spacer and within the fin cavity, wherein the epi etch stop layer is comprised of silicon, forming a stressed epi semiconductor material on the epi etch stop layer, performing at least one process operation to remove the sacrificial gate structure and thereby define a replacement gate cavity, performing at least one etching process through the replacement gate cavity to remove the first epi semiconductor material positioned under the replacement gate cavity selectively relative to the second epi semiconductor material and the substrate portions of the fin structure, wherein the at least one etching process results in the formation of a channel cavity and wherein the epi etch stop layer acts to protect the stressed epi semiconductor material during the at least one etching process, substantially filling at least the channel cavity with an insulating material and forming a replacement gate structure in the replacement gate cavity.

One illustrative device disclosed herein includes, among other things, a fin structure in the channel region of the device comprised of a portion of a semiconductor substrate, a layer of insulating material positioned on and vertically above the portion of the semiconductor substrate and an epi semiconductor material positioned on and vertically above the layer of insulating material, a gate structure positioned above the fin structure in the channel region of the device, sidewall spacers positioned adjacent the gate structure, wherein the fin structure has edges in a gate width direction of the device that are substantially self-aligned with the sidewalls spacers, a fin cavity in the source/drain regions of the device, wherein the substrate defines a bottom of the fin cavity, a silicon etch stop layer positioned on and in contact with the edges of the fin structure and within the fin cavity, and a stressed semiconductor material positioned on and in contact with the silicon etch stop layer and at least partially within the fin cavity.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure of transistors using a so-called "replacement gate" technique; and FIGS. 2A-2K depict various illustrative methods disclosed herein of forming an isolated channel region for a FinFET semiconductor device and the resulting semiconductor device.

Figure 2A:
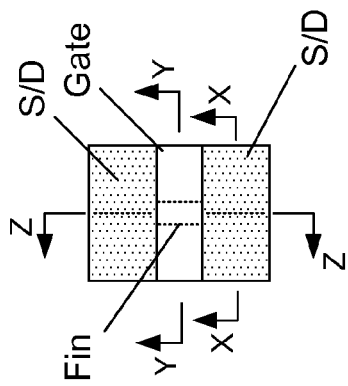
Figure 2A:
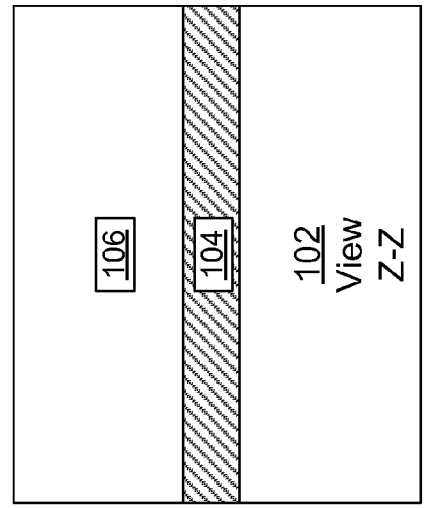
Figure 2A:
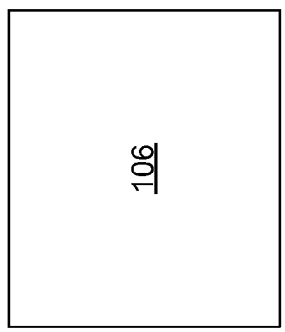
Figure 2A:
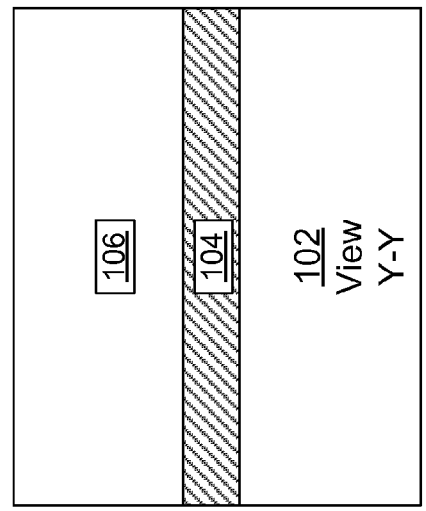

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming an isolated channel region for a FinFET semiconductor device and the resulting semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

In one embodiment, the illustrative device 100 will be formed in and above the semiconductor substrate 102, having a bulk configuration. The device 100 may be either an NMOS or a PMOS transistor. Additionally, various doped regions, e.g., source/drain regions, halo implant regions, well regions and the like, are not depicted in the attached drawings. The substrate 102 may be made of silicon or it may be made of materials other than silicon. In other embodiments, the device 100 may be formed on a so-called silicon-on-insulator (SOI) substrate, as described more fully below. Thus, the terms "substrate" or "semiconductor substrate" should be understood to cover all semiconducting materials and all forms of such materials.

The attached drawings present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view that is taken through the source/drain (S/D) regions of the device (i.e., along the gate width direction of the device 100). The view "Y-Y" is a cross-sectional view that is taken through the gate structure of the device in the gate-width direction. The view Z-Z is a cross-sectional view that is taken through the long axis of the fins 106 of the device (i.e., in the current transport or gate-length direction of the device). The drawings also include a reduced-size plan view of the device 100.

FIG. 2A depicts the device 100 at a point in fabrication wherein several process operations have been performed. First, a first layer of epi semiconductor material 104 is deposited on the surface of the bulk semiconductor substrate 102. In one example, the first layer of epi semiconductor material 104 may be a layer of silicon-germanium ($Si_xGe_{1-x}$). The thickness of the first epi semiconductor material 104 may vary depending upon the particular application. In one illustrative embodiment, the layer of epi semiconductor material 104 may have a thickness of about 5-15 nm. The first epi semiconductor material 104 may be formed using any of a variety of different traditional epitaxial deposition processes. Thereafter, a second layer of epi semiconductor material 106 is deposited on the surface of the first epi semiconductor material 104. In one example, the second layer of epi semiconductor material 106 may be a layer of silicon. The thickness of the second epi semiconductor material 106 may vary depending upon the particular application. In one illustrative embodiment, the second epi semiconductor material 106 may have a thickness of about 20-45 nm. The second epi semiconductor material 106 may be formed using any of a variety of different traditional epitaxial deposition processes.

FIG. 2B depicts the device 100 after one or more first etching processes, e.g., anisotropic etching processes, were performed on the second layer of epi semiconductor material 106 through a patterned mask layer (not shown) to define a plurality of initial trenches 107 in the second layer of epi semiconductor material 106. The formation of the trenches 107 results in the formation of an initial fin structure 108 comprised of a portion of the second layer of epi semiconductor material 106. The width and height of the fin structure 108 as well as the depth of the trenches 107 may vary depending upon the particular application.

FIG. 2C depicts the device 100 after several process operations were performed. First, the trenches 107 were overfilled with an insulating material 110. The layer of insulating material 110 discussed herein may be comprised of a variety of different materials, such as, for example, silicon dioxide, an oxygen-rich silicon dioxide, etc., or multiple layers thereof, etc., and it may be formed by performing a variety of techniques, e.g., chemical vapor deposition (CVD), etc. Although not depicted, if desired, a chemical mechanical polishing (CMP) process may be performed on the layer of insulating material 110 to planarize its upper surface with that of the patterned mask layer 106. Then, a recess etching process was performed to recess the layer of insulating material 110 to a desired height such that the desired amount of the initial fin structure 108 is exposed above the recessed surface 110R of the layer of insulating material 110.

Figure 2D:
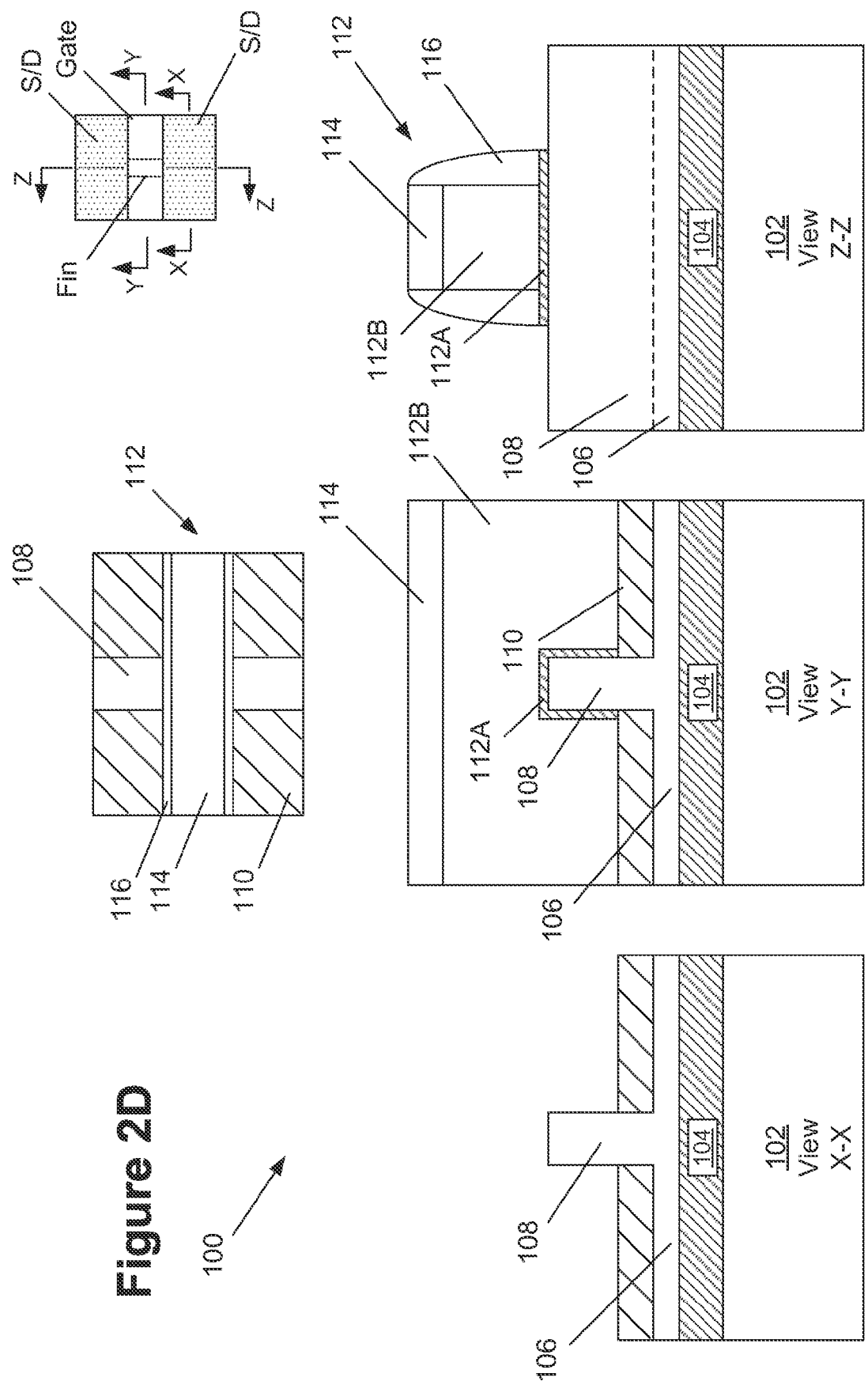

FIG. 2D depicts the device 100 after an illustrative sacrificial gate structure 112, gate cap layer 114 and sidewall spacers 116 have been formed on the device 100. The sacrificial gate structure 112 includes a sacrificial gate insulation layer 112A and a dummy or sacrificial gate electrode 112B. Also depicted is an illustrative gate cap 114 and sidewall spacers 116. The various components and structures of the device 100 may be formed using a variety of different materials and by performing a variety of known techniques. For example, the sacrificial gate insulation layer 112A may be comprised of silicon dioxide and the sacrificial gate electrode 112B may be comprised of polysilicon or amorphous silicon. The various layers of material depicted in FIG. 2D, as well as the layers of material described below, may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature. The gate cap layer 114 and the sidewall spacers 116 may be comprised of a material such as silicon nitride and they may be formed using traditional techniques. For example, the sidewall spacers 116 may be formed by depositing a layer of spacer material, e.g., silicon nitride, and thereafter performing an anisotropic etching process on the layer of spacer material so as to result in the spacers 116.

Figure 2E:
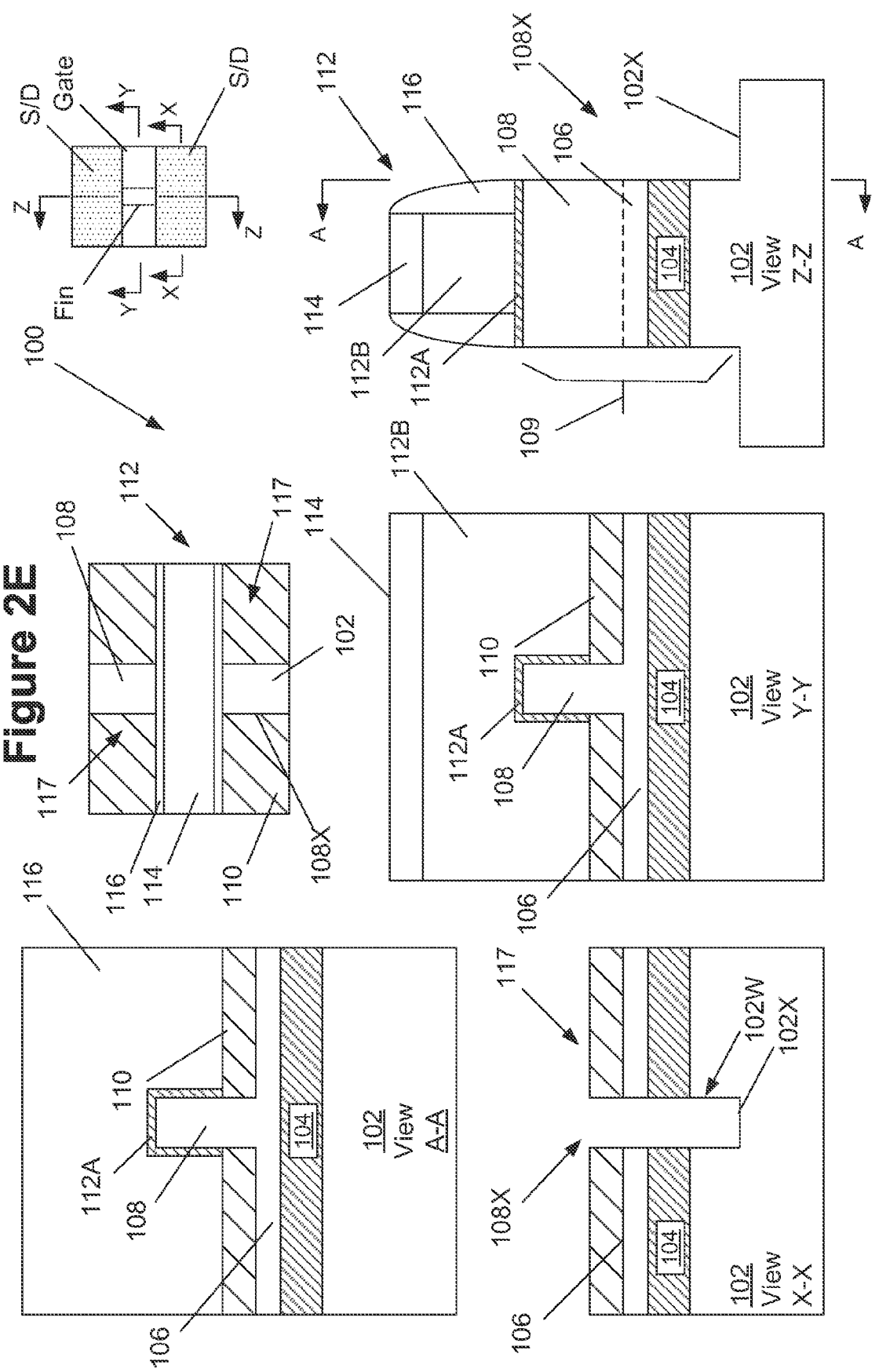

FIG. 2E depicts the device 100 after one or more etching processes were performed to form trenches 102X in the substrate 102. The depth of the trench 102X into the substrate 102 may vary depending upon the application. These etching processes result in the removal of the exposed portions of the second epi material 106 and the first epi material 104 in the areas laterally outside of the spacers 116, i.e., the source/drain regions 117, and in the formation of a fin cavity 108X in the source/drain regions 117. More specifically, these etching processes result in the formation of edges 109 of the fin structure in the gate width direction of the device 100 (i.e., into and out of the plane of the drawing page). As depicted, the exposed edges 109 of the fin structure are substantially self-aligned with the spacers 116. Note that the exposed edges of the fin structure include a portion of the substrate 102, the first epi semiconductor material 104 and the second epi semiconductor material 106. Also note that a portion of the substrate 102 defines a bottom surface of the fin cavity 108X in the source/drain regions of the device 100, and that the sidewalls of the fin cavity 108X are comprised of a portion of the substrate 102, the first epi material 104 and the second epi material 106. FIG. 2E contains a cross-sectional view "A-A" that is taken at the outer edge of the spacers 116 looking back toward the spacer 116. In one illustrative embodiment, the etching processes that result in the structure depicted in FIG. 2E are anisotropic etching processes that result in the etched structures being approximately self-aligned with respect to the sidewall spacers 116.

FIG. 2F depicts the device after an epitaxially formed etch stop layer 118 has been formed on and in contact with the exposed edges 109 of the fin structure, i.e., on the exposed surfaces of the second epi material 106, the first epi material 104 and the substrate 102. The etch stop layer 118 is also formed on and in contact with the semiconductor materials that are exposed within the fin cavity 108X. In one illustrative embodiment, the etch stop layer 118 may be comprised of silicon and it may have a thickness that falls within the range of about 3-10 nm.

FIG. 2G depicts the device 100 after a stressed epi semiconductor material 120 was formed on and in contact with the etch stop layer 118. The stressed epi semiconductor material 120 may be formed with either a tensile or compressive stress depending upon the type of device (N or P) under construction. The purpose of the stressed epi semiconductor material 120 is to impart a desired stress on the materials in the channel region of the device 100. The stressed epi semiconductor material 120 may be made by performing a traditional epitaxial deposition process. In one illustrative embodiment, the stressed epi semiconductor material 120 may be made of silicon-germanium ($S_xGe_{1-x}$), where the concentration of the germanium may also vary depending upon the particular application.

FIG. 2H depicts the device 100 after one or more etching processes were performed to remove the gate cap layer 114 and the sacrificial gate structure 112 and thereby result in the formation of a replacement gate cavity 122 where a replacement gate structure will eventually be formed. As will be appreciated by those skilled in the art after a complete reading of the present application, there are several potential process flows to arrive at the point of processing depicted in FIG. 2H wherein the replacement gate cavity 122 has been created. Thus, the exact process flow that may be used to arrive at the structure depicted in FIG. 2H may vary depending upon the particular application. For example, in some applications, a layer of insulating material (not shown) may be deposited above the epi semiconductor material 120 and one or more CMP processes may be formed to effectively remove the gate cap layer 114 so as to expose the sacrificial gate electrode.

FIG. 2I depicts the device after an isotropic etching process was performed through the replacement gate cavity 122 to remove the underlying portions of the first epi semiconductor material 104 selectively relative to the substrate 102 and the second epi semiconductor material 106. This results in the formation of a channel cavity 124 under the channel region of the device 100. Importantly, the etch stop layer 118 protects the stressed epi semiconductor material 120 during this etching process. Absent the presence of the etch stop layer 118, there may be unwanted consumption of the stressed epi semiconductor material 120, which might tend to reduce or eliminate any desired stresses that are intended to be imparted to the channel region of the device due to the formation of the stressed epi semiconductor material 120.

Figure 2J:
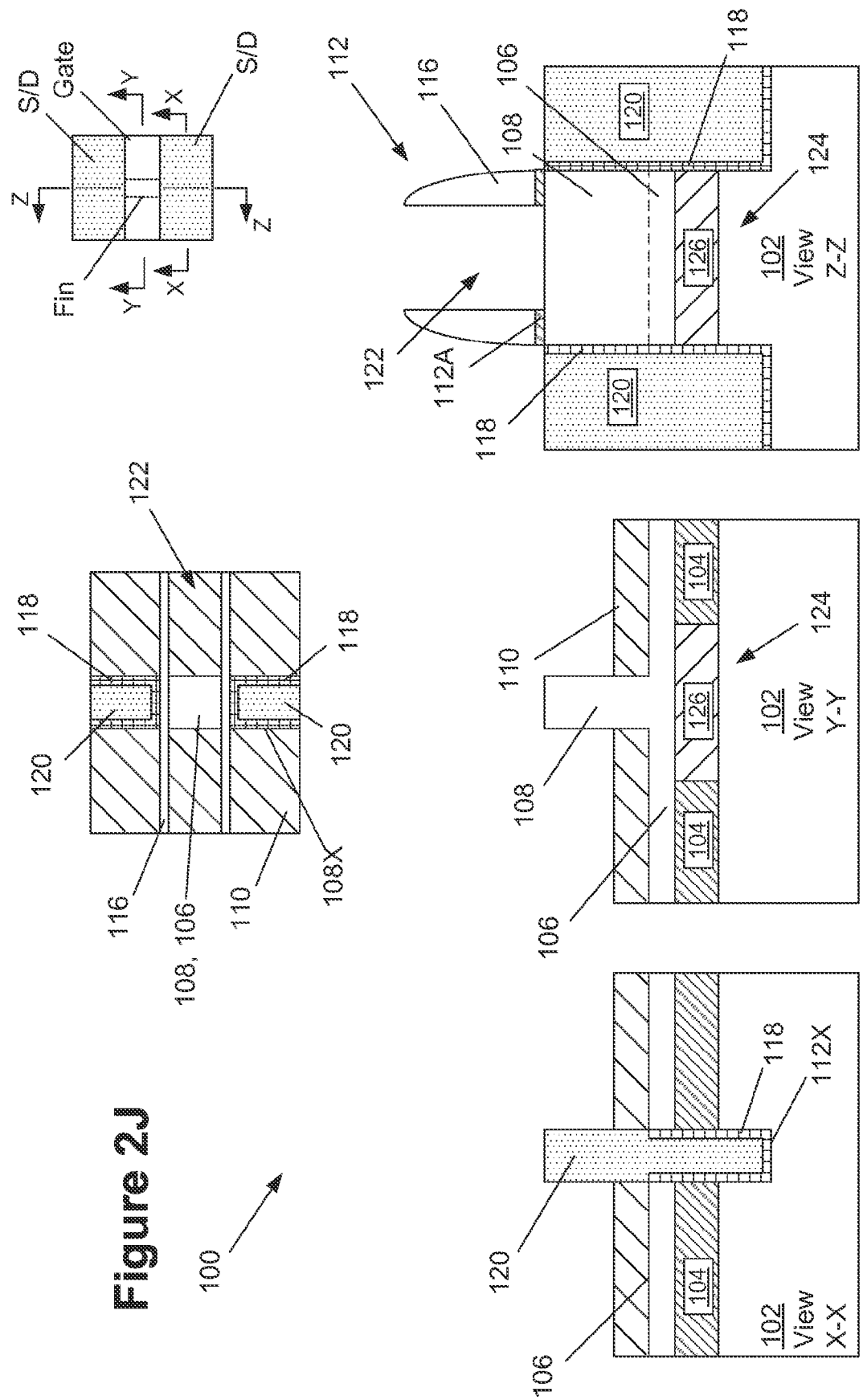

FIG. 2J depict the device 100 after the channel cavity 124 was substantially filled with an insulating material 126, such as silicon dioxide. The insulating material 126 may be formed by performing an ALD deposition process.

FIG. 2K depicts the device after several process operations were performed. First, several known processing operations were performed to form a schematically depicted replacement gate structure 130 in the gate cavity 122. The replacement gate structure 130 depicted herein is intended to be representative in nature of any type of gate structure that may be employed in manufacturing integrated circuit products using so-called gate-last (replacement gate) manufacturing techniques. The replacement gate structure 130 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. Typically, a layer of insulating material 133 (only shown in view Z-Z) is deposited above the device 100. Thereafter, the various layers of material that will be present in the replacement gate structure 130 are sequentially deposited in the gate cavity 122 and one or more CMP processes are performed to remove excess portions of the gate materials positioned outside of the gate cavity 122, as described in the background section of this application. Then, one or more etching processes were performed to remove upper portions of the various materials within the cavity 122 so as to form the replacement gate structure 130 and to form a recess above the replacement gate structure 130. Then, a gate cap 132 was formed in the recess above the recessed gate materials. The gate cap 132 is typically comprised of silicon nitride and it may be formed by depositing a layer of gate cap material so as to over-fill the recess formed in the gate cavity 122 above the replacement gate structure 130 and thereafter performing a CMP process to remove excess portions of the gate cap material layer positioned above the surface of the layer of insulating material 133. The gate cap 132 is formed so as to protect the underlying gate materials during subsequent processing operations. At this point, traditional manufacturing operations may be performed to complete the fabrication of the illustrative FinFET device 100, e.g., contact formation, formation of metallization layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a FinFET device comprised of source/drain regions, the method comprising:
    forming a fin structure comprised of a semiconductor material, a first epi semiconductor material positioned on and vertically above said semiconductor material and a second epi semiconductor material positioned on and vertically above said first epi semiconductor material;
    forming a sacrificial gate structure above said fin structure;
    after forming said sacrificial gate structure, forming a sidewall spacer adjacent said sacrificial gate structure;
    performing at least one etching process to remove the portions of said fin structure positioned laterally outside of said sidewall spacer so as to thereby define a fin cavity in the source/drain regions of said device and to expose edges of the fin structure positioned under said sidewall spacer; and
    performing an epitaxial deposition process to form an epi etch stop layer on the exposed edges of said fin structure positioned under said sidewall spacer and within said fin cavity.

2. The method of claim 1, wherein said substrate and said second epi semiconductor material are silicon and said first epi semiconductor material is silicon-germanium ($Si_xGe_{1-x}$).

3. The method of claim 1, further comprising forming a stressed epi semiconductor material on said epi etch stop layer.

4. The method of claim 3, further comprising performing at least one process operation to remove said sacrificial gate structure and thereby define a replacement gate cavity.

5. A method of forming a FinFET device comprised of source/drain regions, the method comprising:
    forming a fin structure comprised of a portion of a silicon substrate, a first epi semiconductor material positioned on and vertically above said portion of said silicon substrate and a second epi semiconductor material positioned on and vertically above said first epi semiconductor material, wherein said second epi semiconductor material is comprised of silicon;
    forming a sacrificial gate structure above said fin structure;
    after forming said sacrificial gate structure, forming a sidewall spacer adjacent said sacrificial gate structure;
    performing at least one etching process to remove the portions of said fin structure positioned laterally outside of said sidewall spacer so as to thereby define a fin cavity in the source/drain regions of the device and to expose edges of the fin structure positioned under said sidewall spacer;
    performing an epitaxial deposition process to form an epi etch stop layer on the exposed edges of said fin structure positioned under said sidewall spacer and within said fin cavity, wherein said epi etch stop layer is comprised of silicon;
    forming a stressed epi semiconductor material on said epi etch stop layer;
    performing at least one process operation to remove said sacrificial gate structure and thereby define a replacement gate cavity; and
    forming a replacement gate structure in said replacement gate cavity.

6. A method of forming a FinFET device comprised of source/drain regions, the method comprising:
    forming a fin structure comprised of a silicon substrate material, an epi silicon germanium material positioned on, in contact with, and vertically above said silicon substrate material and a epi silicon semiconductor material positioned on, in contact with, and vertically above said epi silicon germanium material;
    forming a sacrificial gate structure above said fin structure;
    after forming said sacrificial gate structure, forming a sidewall spacer adjacent said sacrificial gate structure;
    performing at least one etching process to remove the portions of said fin structure positioned laterally outside of said sidewall spacer so as to thereby define a fin cavity in said source/drain regions of said device and to expose edges of said fin structure positioned under said sidewall spacer;
    performing an epitaxial deposition process to form an epi etch stop layer on the exposed edges of said fin structure positioned under said sidewall spacer and within said fin cavity;
    performing at least one process operation to remove said sacrificial gate structure and thereby define a replacement gate cavity; and
    forming a replacement gate structure in said replacement gate cavity.

7. The method of claim 6, further comprising forming a stressed epi semiconductor material on said epi etch stop layer.

8. The method of claim 4, further comprising forming a replacement gate structure in said replacement gate cavity, said replacement gate structure comprising a gate insulation layer comprised of a high-k insulating material and a gate electrode comprised of at least one layer of metal.

* * * * *